United States Patent [19]

Sandhu et al.

[11] Patent Number: 5,320,880
[45] Date of Patent: Jun. 14, 1994

[54] METHOD OF PROVIDING A SILICON FILM HAVING A ROUGHENED OUTER SURFACE

[75] Inventors: Gurtej S. Sandhu; Trung T. Doan, both of Boise, Id.

[73] Assignee: Micron Technology, Inc., Boise, Id.

[21] Appl. No.: 155,585

[22] Filed: Nov. 18, 1993

Related U.S. Application Data

[63] Continuation-in-part of Ser. No. 963,598, Oct. 20, 1992, abandoned.

[51] Int. Cl.$^5$ .................. B05D 3/06; B05D 3/02; C23C 16/00
[52] U.S. Cl. ...................... 427/578; 427/255.2; 427/376.2; 427/397.7
[58] Field of Search ............ 427/563, 574, 578, 255.1, 427/559, 376.2, 397.7, 255.2

[56] References Cited

U.S. PATENT DOCUMENTS

| | | | |
|---|---|---|---|
| 4,557,943 | 12/1985 | Rosler et al. | 427/574 |
| 4,568,565 | 2/1986 | Gupta et al. | 427/255.2 |
| 4,957,777 | 9/1990 | Ilderem et al. | 427/585 |
| 5,240,739 | 8/1993 | Doan et al. | 427/255.2 |

OTHER PUBLICATIONS

Rosler, et al., "Plasma-Enhanced CVD of Titanium Silicide", *J. Vac. Sci. Technol.*, B2(4), (Oct.-Dec. 1984), pp. 733-737.

Tran, et al., "Polysilicon Films Prepared by Plasma Enhanced Chemical Vapor Deposition: Effect of Substrate Temp. . . ., etc.", *Phys. Stat. Sol.*, (a) 126, K143 (1991) Graphic Research Laboratory (3M Co.) (receive Jul. 8, 1991) but no pub. month given.

Takenaka, et al., "High Mobility Poly-Si TFT's Using Solid Phase Crystallized a-Si Films Deposited, etc.", *Extended Abstracts of the 22nd* (1990 *Int'l. Conference on Solid State Devices,* ) (1990), pp. 955-958 no month given.

*Primary Examiner*—Marianne Padgett
*Attorney, Agent, or Firm*—Wells, St. John, Roberts, Gregory & Matkin

[57] ABSTRACT

A method of providing a silicon film having a roughened outer surface atop a semiconductor wafer comprises: a) placing a semiconductor wafer into a plasma enhanced RF powered chemical vapor deposition reactor; and b) plasma enhanced chemical vapor depositing a layer of silicon over the wafer surface by providing quantities of a silicon source gas, a carrier gas, and $TiCl_4$ to the reactor, the atomic ratio of the quantities of silicon source gas and $TiCl_4$ being greater than or equal to 4 at the wafer surface; and by maintaining the reactor at a selected RF power, pressure and temperature; the RF power being supplied at a frequency of at least 5 MHz and preferably at least 10 MHz, the quantities of silicon source gas, RF power, temperature and pressure being effective to produce a predominately silicon film having an outer surface, the quantity of $TiCl_4$ being effective to induce roughness into the outer silicon surface as compared to an outer silicon surface prepared under identical conditions but for introduction of $TiCl_4$ but ineffective to produce a predominately titanium silicide film.

31 Claims, No Drawings

METHOD OF PROVIDING A SILICON FILM HAVING A ROUGHENED OUTER SURFACE

RELATED PATENT APPLICATION DATA

This patent resulted from a continuation-in-part application of U.S. patent application Ser. No. 07/963,598, filed on Oct. 20, 1992, entitled "Method Of Providing A Silicon Film Having A Roughened Outer Surface". The 07/963,598 application was abandoned Nov. 19, 1993.

TECHNICAL FIELD

This invention relates to methods of providing a silicon film having a roughened outer surface, principally for purposes of increasing capacitance of silicon for incorporation in capacitor constructions.

BACKGROUND OF THE INVENTION

The reduction in memory cell sizes required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include new structures utilizing trench and stacked capacitors, as well as the utilization of new capacitor dielectric materials having higher dielectric constants.

One common material utilized for the capacitor plates is conductively doped polysilicon. Such material is so utilized because of its compatibility with subsequent high temperature processing, good thermal expansion properties with $SiO_2$, and its ability to be conformally deposited over widely varying typography.

As background, silicon occurs in crystalline and amorphous forms. Further, there are two basic types of crystalline silicon known as monocrystalline silicon and polycrystalline silicon. Polycrystalline silicon, or polysilicon for short, is typically in situ or subsequently conductively doped to render the material conductive. Monocrystalline silicon is typically epitaxially grown from a silicon substrate, whereas deposited silicon films result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer.

The prior art has recognized that the capacitance of a polysilicon layer for use in forming capacitors can be increased merely by increasing the surface roughness of the polysilicon film that is used as a storage node. Such roughness is typically transferred to the cell dielectric and overlying polysilicon layer interfaces, resulting in a larger surface area for the same planar area which is available for the capacitor.

One procedure utilized to achieve surface roughening involves deposition under conditions which are intended to inherently induce a rough or rugged upper polysilicon surface. Such include specifically attempted low pressure chemical vapor deposition (LPCVD) techniques. Yet, such techniques are inherently unpredictable or inconsistent in the production of a rugged polysilicon film.

This invention is directed to improved techniques for providing a silicon film having a roughened surface, and particularly to formation of roughened outer surface polysilicon films.

DETAILED DESCRIPTION OF PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, one method of providing a silicon film having a roughened outer surface atop a semiconductor wafer comprises the following steps:

placing a semiconductor wafer into a plasma enhanced RF powered chemical vapor deposition reactor; and plasma enhanced chemical vapor depositing a layer of silicon over the wafer surface by providing quantities of a silicon source gas, a carrier gas, and $TiCl_4$ to the reactor, the atomic ratio of the quantities of silicon source gas and $TiCl_4$ being greater than or equal to 4 at the wafer surface; and by maintaining the reactor at a selected RF power, pressure and temperature; the RF power being supplied at a frequency of at least 5 MHz, the quantities of silicon source gas, RF power, temperature and pressure being effective to produce a predominately silicon film having an outer surface, the quantity of $TiCl_4$ being effective to induce roughness into the outer silicon surface as compared to an outer silicon surface prepared under identical conditions but for introduction of $TiCl_4$ but ineffective to produce a predominately titanium silicide film.

In accordance with another aspect of the invention, a method of providing a polysilicon film having a roughened outer surface atop a semiconductor wafer comprises the following steps:

placing a semiconductor wafer into a plasma enhanced RF powered chemical vapor deposition reactor;

plasma enhanced chemical vapor depositing a layer of amorphous silicon over the wafer surface by providing quantities of silicon source gas, a carrier gas, and $TiCl_4$ to the reactor, the atomic ratio of the quantities of silicon source gas and $TiCl_4$ being greater than or equal to 4 at the wafer surface; and by maintaining the reactor at a selected RF power, a pressure and a temperature; the RF power being supplied at a frequency of at least 5 MHz, the selected quantities of silicon source gas, RF power, temperature and pressure being effective to produce a predominately amorphous silicon film having an outer surface, the selected quantity of $TiCl_4$ being effective to induce roughness into the outer amorphous silicon surface as compared to an outer silicon surface prepared under identical conditions but for introduction of $TiCl_4$ but ineffective to produce a predominately titanium silicide film; and annealing the wafer to render the amorphous silicon polycrystalline.

The silicon source gas could be of several different types, such as silane ($SiH_4$), di-silanes, or organic silanes such as di-tert-butyl silane ($SiH_2(C_2H_9)_2$). The invention was reduced to practice utilizing $SiH_4$.

The quantity of $TiCl_4$ is preferably at an effective minimum to induce the desired roughness, yet also minimize formation of titanium silicide which is a known product of reacting SiH$_4$ and TiCl$_4$. The atomic ratio of the silicon source gas to TiCl$_4$ should be greater than 4 in order to obtain a predominate silicon film, as opposed to a titanium silicide film. Greater ratios are preferred, such as greater than 10:1, greater than 50:1 and greater than 100:1 to minimize titanium silicide.

The selected pressure is preferably from about 0.5 Torr to about 50 Torr, with about 0.5 Torr being most preferred. RF power is preferably provided at a frequency of at least 10 MHz, and applied to the wafer at from about 25 Watts to about 500 Watts, with about 150 Watts believed to be most preferred. The parameters can be selected to deposit a polycrystalline film or an amorphous film. By far the most determinative parameter in this regard is temperature. Preferably, deposition is conducted at 550° C. or below to minimize potential heat damage to the wafer. Annealing of the wafer during conventional subsequent processing steps, and as is well known in the prior art and as described by Wolf and Tauber, "Silicon Processing for the VLSI Era", Volume 1-Process Technology, pp. 161–194, Lattice Press 1986, will induce or render the amorphous silicon into the polycrystalline state. Deposition temperatures higher than about 580° C., such as 600° C. or higher, would produce polysilicon films as deposited.

The invention was reduced to practice utilizing a model Applied Materials 5000 W reactor, which is a single wafer, cold-wall, 6-liter reactor RF reactor supplying RF power at a frequency of 13.6 MHz. Specifically, a six-inch diameter p-type substrate silicon semiconductor wafer was positioned within a plasma enhanced chemical vapor deposition reactor. A six-inch diameter wafer with a single flat has a surface area of approximately 177 cm$^2$. The feed gases in the first example were 20 sccm SiH$_4$ and 5 sccm TiCl$_4$, providing a SiH$_4$:TiCl$_4$ atomic ratio of 4:1. The carrier gas was Ar at 350 sccm Ar. Wafer temperature was maintained at 500° C., with reactor pressure being maintained at 0.8 Torr. RF power to the reactor chamber for inducing the plasma was 300 Watts and frequency was 13.6. Such conditions produced a significantly roughened silicon surface over wafers processed under the same conditions but where no TiCl$_4$ was present in the reactor. With such a reactor, preferred operable flow for the silicon source gas is from about 5 sccm to about 100 sccm, with about 20 sccm being most preferred.

Another example was also conducted utilizing the same six-inch wafer at conditions of 500° C., 1 Torr, 300 Watts at 13.6 MHz, 20 sccm SiH$_4$, 3 sccm TiCl$_4$ and 300 sccm Ar. Such conditions also produced a significantly roughened silicon surface over wafers processed under the same conditions but where no TiCl$_4$ was present in the reactor. An Auger Analysis of this film deposited in accordance with the invention, where the atomic ratio of SiH$_4$:TiCl$_4$ was 20:3, showed a ratio in the film of Si:Ti being greater than 9:1.

Upon opening the reactor door to remove the processed wafer, it was discovered that TiCl$_4$ had actually been physically or chemically incorporated into the anodized aluminum metal reactor sidewalls. This was determined as the reactor sidewalls began fuming as soon as they were exposed to atmosphere. Such fuming results from TiCl$_4$ reacting with air.

In another example, roughened polysilicon was deposited in accordance with the above described 3 sccm TiCl$_4$ feed during deposition. At the conclusion of this process, the processed wafer was removed from the reactor and another unprocessed wafer substituted in its place without any intervening exposure of the reactor to oxygen to prevent any TiCl$_4$ still present from reacting therewith. With the second wafer, a 500 Angstrom thick layer was deposited under the above first described conditions, but with *no* TiCl$_4$ being fed to the reactor during the 60 seconds time of deposit. Such still produced a very roughened upper silicon surface.

Such evidences that even trace amounts TiCl$_4$ coming off of the reactor sidewalls is sufficient to induce the desired roughness. Under such conditions, reactor atomic ratio of SiH$_4$:TiCl$_4$ was believed to be greater that 100:1. It was also determined that the roughness effect observed was indeed the result of TiCl$_4$ remaining on the sidewalls and not some other phenomena, as the next and subsequent depositions under the same conditions (no TiCl$_4$ feed) produced no roughness. Apparently there was enough TiCl$_4$ on the reactor sidewalls to induce roughness in one more run, but not more unless TiCl$_4$ was reintroduced into the reactor.

It might be desirable after deposition of a silicon film in accordance with the invention to deposit a very thin film atop the wafer over the roughened outer silicon surface to impart permanency to the roughness. Such would be desired to prevent any subsequent wafer processing to potentially impart smoothness to the roughened outer surface. A preferred thickness for such a film would be from about 50 Angstroms to about 1500 Angstroms, with about 200 Angstroms being most preferred. Such a film could comprise silicon, such as, by way of example, amorphous silicon which would be rendered polycrystalline by subsequent processing steps. Alternately in capacitor formation, such a thin film might comprise a capacitor dielectric layer.

In another aspect of the invention, TiCl$_4$ flow is stopped after a short initial feed interval of perhaps 5 to 25 seconds. In this aspect, the method comprises the following sequential steps:

placing a semiconductor wafer into a plasma enhanced RF powered chemical vapor deposition reactor;

plasma enhanced chemical vapor depositing a first layer of silicon over the wafer surface by feeding selected quantities of a silicon source gas, a carrier gas, and TiCl$_4$ to the reactor, the atomic ratio of the selected quantities of silicon source gas and TiCl$_4$ being greater than or equal to 4 at the wafer surface; and by maintaining the reactor at a selected RF power, selected pressure and selected temperature; the RF power being supplied at a frequency of at least 5 MHz, the selected quantities of silicon source gas, RF power, temperature and pressure being effective to produce a first predominately silicon film having a first outer surface, the selected quantity of TiCl$_4$ being effective to induce roughness into the first outer silicon surface as compared to an outer silicon surface prepared under identical conditions but for introduction of TiCl$_4$ but ineffective to produce a predominately titanium silicide film; and ceasing to feed TiCl$_4$ to the reactor while continuing to feed the silicon source gas to the reactor, and maintaining RF power, pressure and temperature at quantities effective to deposit a second layer of silicon atop the outer surface of the first layer of silicon, the second layer of silicon having a second outer surface, the first outer surface at least in part inducing roughness into the second outer surface.

The first outer surface is indicated to "at least in part" induce roughness into the second outer surface due to the TiCl$_4$ and reactor sidewall phenomena referred to above. Even though TiCl$_4$ flow be stopped, TiCl$_4$ on the reactor sidewalls would be displaced and might contribute to outer surface roughness of the second layer. Also, parameters (such as temperature) can be controlled to render one or both of the first or second layers amorphous or polycrystalline, as desired. Where one or more amorphous layers are deposited, such can be rendered polycrystalline upon anneal as referred to above.

The above described processes have distinct advantages over prior art silicon LPCVD processes. For example, such prior art processes for inducing roughness typically have very narrow process windows of about 10° C. in order to achieve any roughening effect. Here, the process window will be very large (greater than 100° C.). Such is extremely beneficial for process stability and repeatability in a manufacturing environment.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of providing a silicon film having a roughened outer surface atop a semiconductor wafer, the method comprising the following steps:
   placing the semiconductor wafer having a surface into a plasma enhanced RF powered chemical vapor deposition reactor; and
   plasma enhanced chemical vapor depositing a layer of silicon over the wafer surface by providing quantities of a silicon source gas, a carrier gas, and $TiCl_4$ to the reactor, an atomic ratio of the quantities of the silicon source gas and the $TiCl_4$ being greater than or equal to 4 at the wafer surface; and by maintaining the reactor at an RF power, a pressure and a temperature; the RF power being supplied at a frequency of at least 5 MHz, the quantities of the silicon source gas, the RF power, the temperature and the pressure being effective to produce a predominately silicon film having the outer surface, the quantity of the $TiCl_4$ being ineffective to produce a predominately titanium silicide film.

2. The method of providing a silicon film having a roughened outer surface of claim 1 wherein the RF power is supplied at a frequency of at least 10 MHz.

3. The method of providing a silicon film having a roughened outer surface of claim 1 wherein the atomic ratio of the quantities of the silicon source gas and the $TiCl_4$ is greater than or equal to 10.

4. The method of providing a silicon film having a roughened outer surface of claim 1 wherein the atomic ratio of the quantities of the silicon source gas and the $TiCl_4$ is greater than or equal to 50.

5. The method of providing a silicon film having a roughened outer surface of claim 1 wherein the atomic ratio of the quantities of the silicon source gas and the $TiCl_4$ is greater than or equal to 100.

6. The method of providing a silicon film having a roughened outer surface of claim 1 wherein the RF power, the pressure and the temperature are selected to deposit a polycrystalline silicon film.

7. The method of providing a silicon film having a roughened outer surface of claim 1 further comprising depositing a 50 Angstrom to 1500 Angstrom thin film atop the wafer over the outer silicon surface to impart permanency to its contour.

8. The method of providing a silicon film having a roughened outer surface of claim 1 wherein the silicon source gas comprises $SiH_4$.

9. A method of providing a polysilicon film having a roughened outer surface atop a semiconductor wafer, the method comprising the following steps:
   placing the semiconductor wafer having a surface into a plasma enhanced RF powered chemical vapor deposition reactor;
   plasma enhanced chemical vapor depositing a layer of amorphous silicon over the wafer surface by providing quantities of a silicon source gas, a carrier gas, and $TiCl_4$ to the reactor, an atomic ratio of the quantities of the silicon source gas and the $TiCl_4$ being greater than or equal to 4 at the wafer surface; and by maintaining the reactor at an RF power, a pressure and a temperature; the RF power being supplied at a frequency of at least 5 MHz, the quantities of the silicon source gas, the RF power, the temperature and the pressure being effective to produce a predominately amorphous silicon film having the outer surface, the quantity of the $TiCl_4$ being ineffective to produce a predominately titanium silicide film; and
   annealing the wafer to render the amorphous silicon polycrystalline.

10. The method of providing a polysilicon film having a roughened outer surface of claim 9 wherein the RF power is supplied at a frequency of at least 10 MHz.

11. The method of providing a polysilicon film having a roughened outer surface of claim 9 wherein the atomic ratio of the quantities of the silicon source gas and the $TiCl_4$ is greater than or equal to 10.

12. The method of providing a polysilicon film having a roughened outer surface of claim 9 wherein the atomic ratio of the quantities of the silicon source gas and the $TiCl_4$ is greater than or equal to 50.

13. The method of providing a polysilicon film having a roughened outer surface of claim 9 wherein the atomic ratio of the quantities of the silicon source gas and the $TiCl_4$ is greater than or equal to 100.

14. The method of providing a polysilicon film having a roughened outer surface of claim 9 further comprising depositing a 50 Angstrom to 1500 Angstrom thin film atop the wafer over the outer silicon surface to impart permanency to its contour.

15. The method of providing a silicon film having a roughened outer surface of claim 9 wherein the silicon source gas comprises $SiH_4$.

16. A method of providing a silicon film having a roughened outer surface atop a semiconductor wafer, the method comprising the following sequential steps:
   placing the semiconductor wafer having a surface into a plasma enhanced RF powered chemical vapor deposition reactor;
   plasma enhanced chemical vapor depositing a first layer of silicon over the wafer surface by feeding quantities of a silicon source gas, a carrier gas, and $TiCl_4$ to the reactor, an atomic ratio of the quantities of the silicon source gas and the $TiCl_4$ being greater than or equal to 4 at the wafer surface; and by maintaining the reactor at an RF power, a pressure and a temperature; the RF power being supplied at a frequency of at least 5 MHz, the quantities of the silicon source gas, the RF power, the temperature and the pressure being effective to produce a first predominately silicon film having a first outer surface, the quantity of the $TiCl_4$ being effective to induce roughness into the first outer silicon surface as compared to an outer silicon surface prepared under identical conditions but for introduction of the $TiCl_4$ but the quantity of the $TiCl_4$ being ineffective to produce a predominately titanium silicide film; and ceasing to feed the $TiCl_4$ to the reactor while continuing to the silicon source gas to the reactor, and maintaining the RF power, the pressure and the temperature at quantities effective to deposit a second layer of silicon atop the first outer surface of the first layer of silicon, the second layer of silicon having a second outer surface, the first outer surface at least in part inducing roughness into the second outer surface.

17. The method of providing a silicon film having a roughened outer surface of claim 16 wherein the RF power is supplied at a frequency of at least 10 MHz.

18. The method of providing a silicon film having a roughened outer surface of claim 16 wherein the atomic ratio of the quantities of the silicon source gas and the $TiCl_4$ is greater than or equal to 10.

19. The method of providing a silicon film having a roughened outer surface of claim 16 wherein the atomic ratio of the quantities of the silicon source gas and the $TiCl_4$ is greater than or equal to 50.

20. The method of providing a silicon film having a roughened outer surface of claim 16 wherein the atomic ratio of the quantities of the silicon source gas and the $TiCl_4$ is greater than or equal to 100.

21. The method of providing a silicon film having a roughened outer surface of claim 16 wherein the RF power, the pressure and the temperature are selected to deposit the first layer of silicon which is polycrystalline.

22. The method of providing a silicon film having a roughened outer surface of claim 16 wherein the RF power, the pressure and the temperature are selected to deposit polycrystalline first and second layers of silicon.

23. The method of providing a silicon film having a roughened outer surface of claim 16 further comprising depositing a 50 Angstrom to 1500 Angstrom thin film atop the wafer over the second roughened outer silicon surface to impart permanency to the roughness.

24. The method of providing a silicon film having a roughened outer surface of claim 16 wherein the silicon source gas comprises $SiH_4$.

25. A method of providing a polysilicon film having a roughened outer surface atop a semiconductor wafer, the method comprising the following sequential steps:

placing the semiconductor wafer having a surface into a plasma enhanced RF powered chemical vapor deposition reactor;

plasma enhanced chemical vapor depositing a first layer of amorphous silicon over the wafer surface by feeding quantities of a silicon source gas, a carrier gas, and $TiCl_4$ to the reactor, an atomic ratio of the quantities of the silicon source gas and the $TiCl_4$ being greater than or equal to 4 at the wafer surface; and by maintaining the reactor at an RF power, a pressure and a temperature; the RF power being supplied at a frequency of at least 5 MHz, the quantities of the silicon source gas, the RF power, the temperature and the pressure being effective to produce a first predominately amorphous silicon film having a first outer surface, the quantity of the $TiCl_4$ being effective to induce roughness into the first outer amorphous silicon surface as compared to an outer amorphous silicon surface prepared under identical conditions but for introduction of the $TiCl_4$ but the quantity of the $TiCl_4$ being ineffective to produce a predominately titanium silicide film;

ceasing to feed the $TiCl_4$ to the reactor while continuing to feed the silicon source gas to the reactor, and maintaining the RF power, the pressure and the temperature at quantities effective to deposit a second layer of silicon atop the first outer surface of the first layer of silicon, the second layer of silicon having a second outer surface, the first amorphous outer surface at least in part inducing roughness into the second outer surface; and annealing the wafer to render the first amorphous film polycrystalline.

26. The method of providing a polysilicon film having a roughened outer surface of claim 25 wherein the RF power is supplied at a frequency of at least 10 MHz.

27. The method of providing a polysilicon film having a roughened outer surface of claim 25 wherein the atomic ratio of the quantities of the silicon source gas and the $TiCl_4$ is greater than or equal to 10.

28. The method of providing a polysilicon film having a roughened outer surface of claim 25 wherein the atomic ratio of the quantities of the silicon source gas and the $TiCl_4$ is greater than or equal to 50.

29. The method of providing a polysilicon film having a roughened outer surface of claim 25 wherein the atomic ratio of the quantities of the silicon source gas and the $TiCl_4$ is greater than or equal to 100.

30. The method of providing a silicon film having a roughened outer surface of claim 25 wherein the RF power, the pressure and the temperature are selected to deposit a first layer of silicon which is amorphous, the step of annealing comprising annealing the wafer to render the first and second films polycrystalline.

31. The method of providing a polysilicon film having a roughened outer surface of claim 25 further comprising depositing a 50 Angstrom to 1500 Angstrom thin film atop the wafer over the roughened outer silicon surface to impart permanency to the roughness.

* * * * *